United States Patent [19]

McClaskey, Boyd M. et al.

[11] 3,949,305
[45] Apr. 6, 1976

[54] DIGITAL SYNTHESIZER

[75] Inventors: Boyd M. McClaskey, Flourtown; John F. Smith, Warminster, both of Pa.

[73] Assignee: Narco Scientific Industries, Inc., Fort Washington, Pa.

[22] Filed: Jan. 23, 1975

[21] Appl. No.: 543,538

[52] U.S. Cl. ............... 325/421; 331/1 A; 332/18
[51] Int. Cl.² ............................................. H03B 3/08
[58] Field of Search...... 325/17, 148, 184, 418–423; 328/46, 48, 134, 140, 141, 155; 331/1 A, 1 R, 14, 18, 22, 25; 178/69.5 R

[56] References Cited
UNITED STATES PATENTS

| | | | |
|---|---|---|---|
| 3,372,339 | 3/1968 | Harrison et al. ................. | 325/421 |
| 3,657,658 | 4/1972 | Kubo ............................... | 328/48 X |
| 3,696,422 | 10/1972 | Burrell ........................... | 325/17 X |
| 3,805,192 | 4/1974 | Ocnaschek et al. ............. | 331/25 X |

*Primary Examiner*—Benedict V. Safourek
*Attorney, Agent, or Firm*—Paul & Paul

[57] ABSTRACT

In order to produce signals having a desired communication channel frequency, a phase locked loop is provided, along with appropriate frequency division. For channels in the megahertz range having bandwidth in the kilohertz range, a kilohertz reference is provided for comparison, to drive the voltage controlled oscillator. The oscillator output is divided by the megahertz quantity, and by optional division multiples in the kilohertz channel range. In particular, a first division ratio is utilized for a portion of a reference cycle, and a second division ratio for the remainder of this cycle. Preloaded logic controls the two division rates, and by adjusting the portions of the cycle, correspondingly regulates the effective division ratio for the loop, and yields the proper channel frequency for locking.

6 Claims, 2 Drawing Figures

3,949,305

DIGITAL SYNTHESIZER

BACKGROUND OF THE INVENTION

This invention relates to avionics communication equipment, and more particularly to phase locking apparatus for channel selection and tuning in avionics communication systems.

In accordance with standard procedures and federal law, rigid specifications are established for communication equipment. For airborne communication apparatus, a 720 channel band, of 25 KHz width is specified, spaced in the frequency band 118 through 135.975 MHz. Communication occurs between an airborne person and others by selecting an available one of the 720 channels and communicating thereon.

Within these established constraints, there exists a need for effective tuning and channel selection apparatus whereby the user may, by manually selecting a channel for communication, be able promptly and effectively to communicate thereon. Moreover, once a channel allocation is made, the apparatus must be capable of maintaining tight frequency supervision over the allocated channel, to avoid such problems as loss of connection between the communicating parties, co-channel interference and crosstalk, and the like.

General objects of the present invention include providing avionics communication equipment which meets relevant FCC and FAA specifications, and furthermore functions in a convenient effective manner within the above requirements.

One approach to frequency supervision and control is the use of phase locked loops. Typically, these loops feature phase or frequency comparison of the signal to be synchronized with a reference signal, and utilization of the difference noted to adjust the frequency of a voltage controlled oscillator. The oscillator output in turn constitutes the signal to be snythesized.

It is an object of the present invention to provide phase locking apparatus adapted for utilization in avionics communication gear. Such application, however, is not straightforward because of difficulties attendant to the wide frequency spectrum of the communication channels. That is, the narrow band channels spread over a wide, relatively high frequency range make it difficult to apply phase locking techniques. More specifically, the avionics band of 118 through 135.975 MHz, with 25 KHz channel bands, makes straightforward application of phase locking techniques difficult, because use of plural, even frequency division factors conventionally involves apparatus of considerable complexity.

It is accordingly a further object of the present invention to apply phase locking techniques to multiple channel, relatively high frequency communication systems, and specifically to the avionics band.

SUMMARY OF THE INVENTION

The present invention involves phase locking apparatus and techniques for utilization particularly in avionics communication utilizing a time averaging of separate division factors. That is, for selection of a given channel, first and second division factors are applied for respective, complimentary portions of each cycle of the loop reference signal, whereby the average division factor per cycle produces the desired frequency division of the signal for phase or frequency comparison with the reference.

In an illustrative embodiment, electro-mechanical selection apparatus produces a digitally encoded signal representative of the channel upon which communication is to be carried out. The MHz designation of the channel sets a corresponding MHz counter in the phase locked loop. The KHz designation sets preloaded logic, which in turn allocates the portion of each output cycle during which first and second respective pulse counters (corresponding to respective division factors) in the loop are to be energized. The output of a voltage controlled oscillator, which may vary throughout the communication signal band, is coupled to the respective division circuits, and the divided signal is phase compared with a reference signal. The phase disparity is filtered and amplified, and coupled back to regulate the voltage controlled oscillator. Thus, the MHz counter is functioning during the entire count cycle, and the kilohertz counter causes a "slowdown" of counts for a predetermined part of the cycle.

DETAILED DESCRIPTION

Prior to detailed discussion of a preferred embodiment of the present invention, it may be advantageous to set forth the design problem in somewhat greater detail. Although phase locked loops have been conventionally used for some time, their application to specific design problems is not always straightforward. In particular, the phase locking involved in avionics communication systems presents particular problems due to the high frequency and wide spacing of the overall communication band, with the relatively narrow channel bands spaced therein. For example, if the channels were spaced at even MHz multiples, it would be simple to achieve phase locking by merely dividing the voltage controlled oscillator output by the specified MHz count. However, the actual channels are only 25 KHz in width, and are spread continuously in the uneven band of 118 MHz through 147 MHz. Thus, the phase locked loop must be freely tunable to any of the channels, and once located they must be held precisely in phase locked relation.

Figure 1:
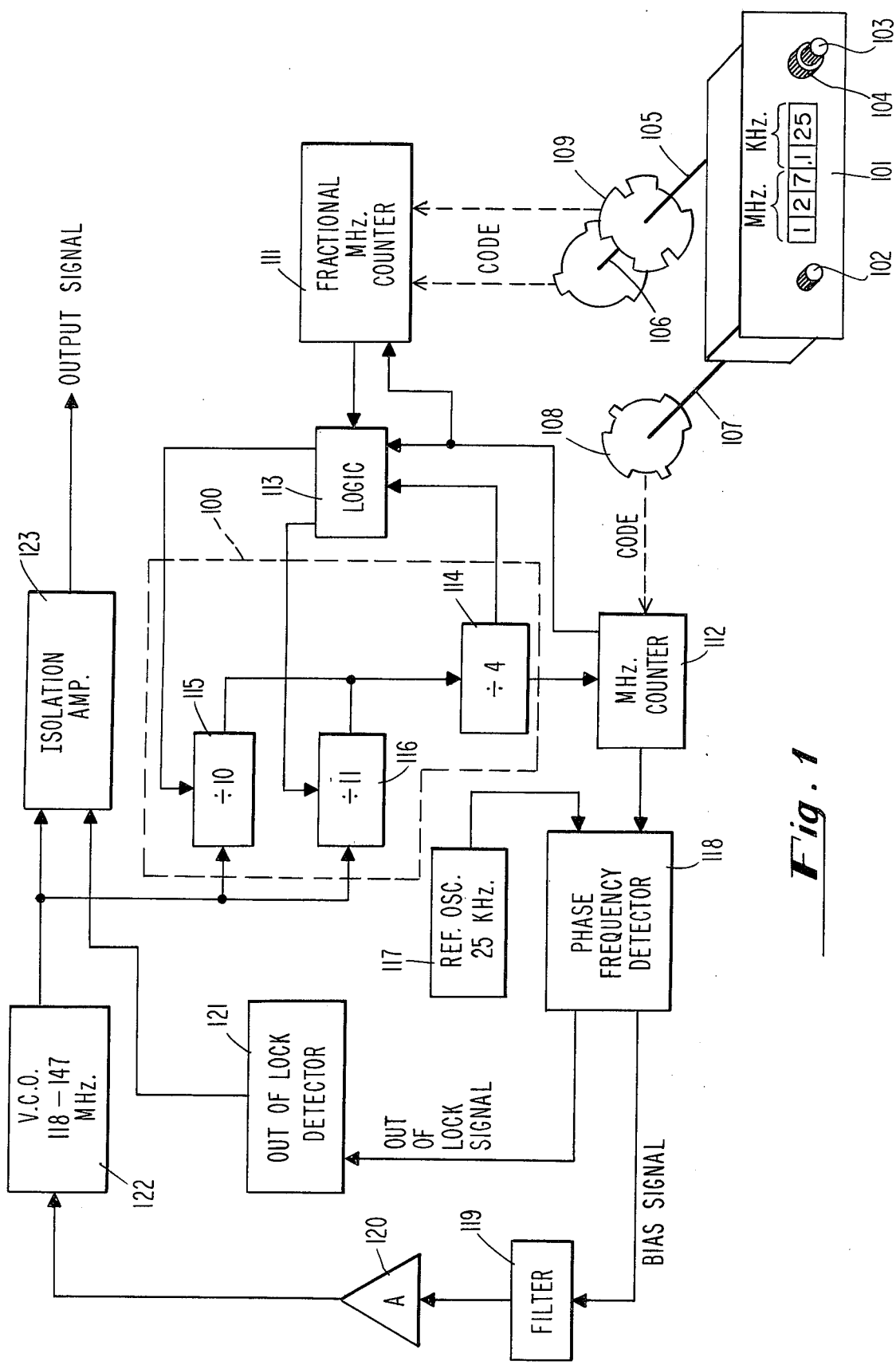
FIG. 1 shows a block diagram of synthesizer apparatus embodying the principles of the present invention.

In FIG. 1 there is shown a preferred embodiment of the principles of the present invention, which meets the functional constraints for avionics communication equipment. A mechanical channel selection box 101 features a MHz selection knob 102, a hundreds of KHz selection knob 103, and a combined tens-units selection knob 104, graduated in increments of 25 KHz. The selection apparatus 101 is embodied as set forth in a U.S. Pat. No. 3,879,692 to William L. Wisser, etal., entitled "Avionics Channel Selection Apparatus," and assigned to the assignee hereof. As set forth in that application, the MHz range and KHz range control knobs actuate rotary wafer switches 108, 109 and 110 by means of respective shafts 105, 106 and 107. Thus, the rotary positioning of the switches 108, 109 and 110 relative to fixed electrical contacts in the proximity thereof produce a code indicative of the MHz and KHz identification of the channel to be used. As shown in FIG. 1, 127.125 MHz is the channel upon which communication is desired. A novel coding arrangement to be utilized in conjunction with the remaining apparatus is set forth in a co-pending application of Boyd M. McClaskey and John F. Smith entitled "Digital Synthesizer with Improved Coding Arrangement," assigned to the assignee hereof and filed concurrently herewith, Ser. No. 543,540.

The coded MHz and KHz (i.e. fractional MHz) channel designation representations are utilized to set division ratios in the "pulse swallowing" phase locked loop embodying the principles of the present invention. In particular, the MHz code from switch 108 sets a MHz counter 112, and the KHz designations from switches 109 and 110 set a fractional MHz counter 111.

The basic structure of the embodiment shown in the drawings constitutes a phase locked loop in which a voltage controlled oscillator 122 produces pulse signals having frequencies variable through the output frequency band in response to a voltage input. The oscillator output pulses are divided down by appropriate counting ratios such that they may be phase or frequency compared with a reference. For the 25 KHz channel bandwidth utilized, a reference signal of 25 KHz is produced by an oscillator 117, the pulses of which are compared with the divided output from the voltage controlled oscillator 122 at a phase/frequency detector 118. Each cycle of the signal to be compared at detector 118 with the 25 KHz reference shall be referred to herein as an "epoch." The phase differential between respective pulses of the two signals being compared at the detector 118 produces a bias signal, which conventionally is filtered at 119, amplified as desired at 120, and applied back to the frequency determining input of the voltage controlled oscillator 122. The output of oscillator 122 is coupled to an isolation amplifier 123, whereupon it may be utilized as an output signal. In addition, assuming the respective signals at detector 118 are shown by an out of lock detector 121 not to be sufficiently synchronous with one another, the passage of signals from the voltage controlled oscillator to output terminals is blocked at the isolation amplifier 123. The out of lock detector 121 is set forth in a co-pending application of Boyd M. McClaskey, assigned to the assignee hereof, entitled "Out of Lock Detector for Phase Lock Loop Synthesizer," Ser. No. 522,053 filed Nov. 8, 1974.

Figure 2:
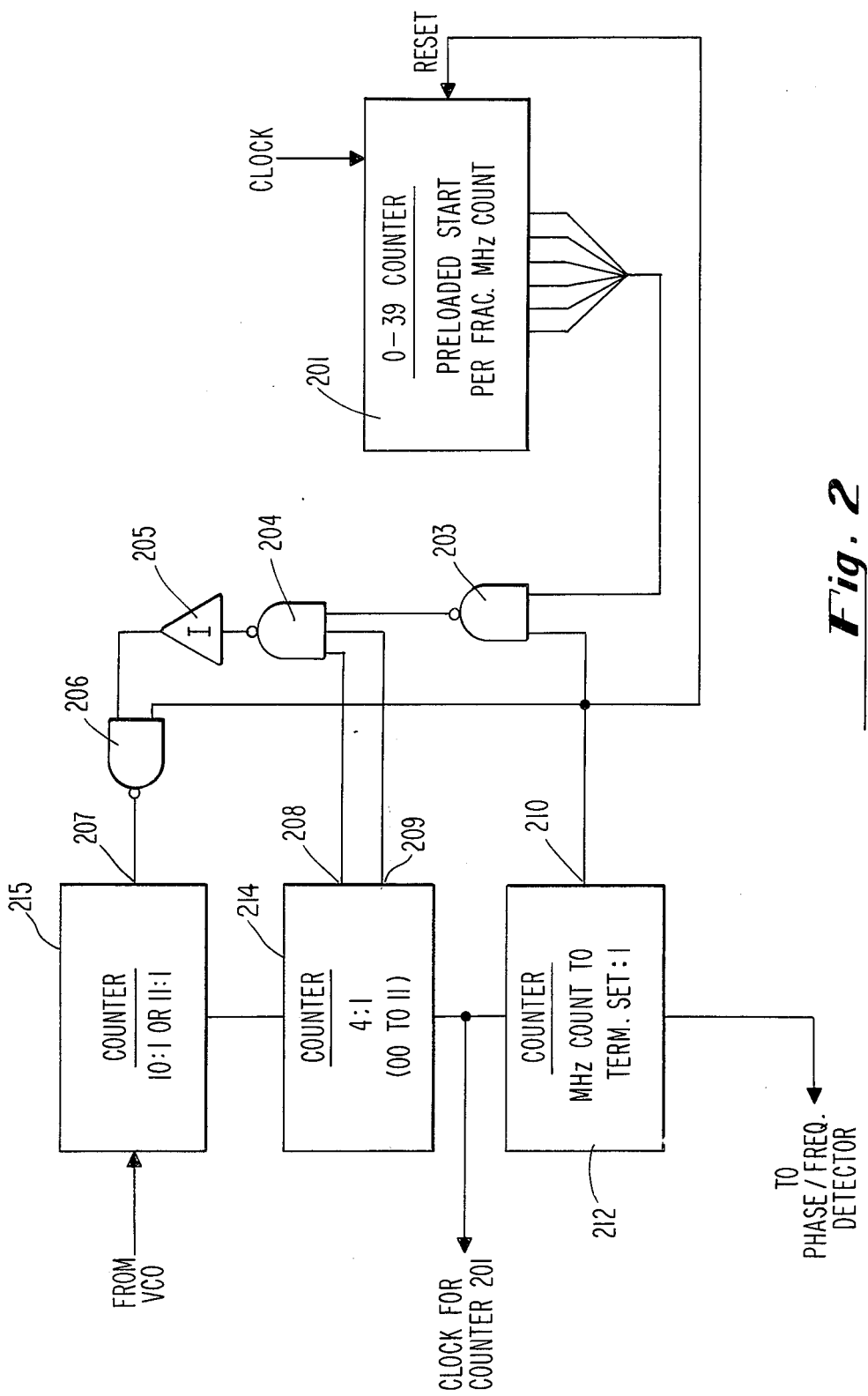
FIG. 2 shows in greater detail certain logic circuitry of the FIG. 1 embodiment.

The novel operation of the embodiment of FIG. 1 relates principally to its pulse division circuitry, and logic attendant thereto. In particular, signals from the voltage controlled oscillator 122 are coupled to a counter 100 (including 114, 115, and 116) which frequency divides the pulse signal from the oscillator 122 by factors of 40 or 41. It is to be understood that the counters 115 and 116 may be embodied with equal facility either by discrete shift register type apparatus with attendant logic, as shown symbolically in FIG. 1, or by a single shift register-counter with logic adjustable between binary counts of 10 or 11, as shown in FIG. 2. Then still another counter 112, set by the MHz code from the rotary switch 108, further frequency divides the signal by a factor representative of the MHz setting of the desired channel. Pulses from counter 112 in turn are coupled to the phase/frequency detector 118 for comparison with the 25 KHz reference signal from oscillator 117.

In accordance with the principles of the present invention, the counters 115 and 116 are alternately enabled and disabled, such that in conjunction with counters 112 and 114 the signal from the voltage controlled oscillator 122 always is divided to the proper frequency level for comparison with the 25 KHz reference, regardless of the particular channel frequency being utilized. More particularly, the division factors 10 and 11 from counters 115 and 116, in conjunction with the division factor 4 of counter 114 are utilized alternately during each counting cycle of counter 114 such that the effective division ratio through counter 114 is either 40 or 41. In turn, the fractional MHz counter 111 and associated logic 113 precisely regulates the portion of time per epoch during of which the effective division ratio is 41, and the remainder of time during which the effective ratio is 40.

Actually, the logic 113 operates in response to the divide by 4 counter 114 and the fractional MHz counter 111 based on the proposition that the longer the apparatus is in the divide by 41 mode, the longer it takes the MHz counter 112 to emit each pulse. Accordingly, a disparity occurs at the phase/frequency detector 118, and the frequency of the voltage controlled oscillator is increased. As this occurs more and more times, up to the point where the fractional MHz count is matched, the frequency of the voltage controlled oscillator 122 increases. The dependency of logic 113 on the divide by 4 counter 114 allows for the alternate divide by 40, divide by 41 setup, in that, under control of the divide by 4 counter 114, the divide by 11 counter 116 is energized for a specified proportion of time once during each cycle of the divide by 4 counter 114. Since 40 channels are spaced in each MHz of the allowed band, the coded representation delivered from switch 108 to preset the fractional MHz counter 112 determines the number of cycles out of 40 of the divide by 4 counter 114 (i.e., the portion of each epoch) which are to be occupied three fourths in the divide by 40 mode and one fourth in the divide by 41 mode. For example, for the 127.125 MHz channel shown in FIG. 1, the KHz designation of 125 would indicate that five cycles of the divide by 4 counter 114 per epoch would utilize only the divide by 11 mode. For each cycle of the divide by 4 counter 114, the voltage controlled oscillator 122 effectively "jumps up" to the next successive channel frequency, and after five such jumps, would be 125 KHz above the 127 MHz setting of counter 112. That is, since there are forty 25 KHz jumps between MHz frequencies, the fractional MHz counter 111, logic 113, and divide by 4 counter 114 correspondingly determine a setting between 0 and 39 for the number of cycles of the divide by 4 counter 114 per epoch which operate in joint conjunction with divide by 10 counter 115 and divide by 11 counter 116 on a three-fourths-one-fourth basis.

It is to be noted that during each cycle of the MHz counter 113 the pulses come through at two different rates, i.e., a first rate during a divide by 41 portion and a second rate during the divide by 40 portion. However, the output of the voltage controlled oscillator, which is the end product, remains stable because the bias signal from the phase detector 118 represents an integrated or average signal and does not reflect the discrete changes in operation of the division ratios in counter 115 and 116. Furthermore, at times such as startup when the VCO 122 may be far from the desired frequency, the 40/41 factor has negligible effect on the phase detector 118 since the frequency disparity itself is so large.

A more detailed representation of logic to advantageously embody the fractional MHz counter 111 the logic 113 and the counters 112, 114, 115 and 116 of FIG. 1 is set forth in FIG. 2. A pulse signal from the voltage controlled oscillator is coupled to a first counter 215, which divides by 10 or by 11, depending upon the voltage presented at a control terminal 207. Specifically, counter 215 emits one output pulse for each ten input pulses when the control terminal 207 is in the "high" or logical one state, and emits one pulse for each eleven input pulses when the control terminal 207 is "low" or in the logical zero state. Pulses from counter 215 are coupled to a divide by 4 counter 214, which produces a binary count of "00" through "11" at output terminals 208 and 209 depending on the current counting state. For each four pulses received from the first counter 215, the divide by 4 counter 214 passes one pulse onto a MHz counter 212. The MHz counter commences a binary counting sequence beginning with the coded MHz setting for the channel to be utilized, and counting in downward succession through a terminal setpoint, such that the counter has incremented a number of times equal to the selected MHz setting. Each time the terminal setpoint count is reached, a "high" or logical one signal is produced at an output terminal 210, after which the counter 212 is reset and commences counting again.

It may therefore be seen that output terminals 208 and 209 of the divide by 4 counter 214 are both in the logical one state during one fourth of each full cycle of counter 214, and the output terminal 210 of counter 212 is in a logical one state for one counting interval during each full counting cycle thereof.

A 40 increment counter 201 is clocked from output pulses from the divide by 4 counter 214 to the MHz counter 212. Accordingly, a counting period occurs at the counter 201 for every ten full output cycles of terminals 208 and 209 of the counter 214. Likewise, for each 40 increment full count cycle of counter 201, there occurs ten evenly spaced time periods in which both terminals 208 and 209 of counter 214 are "high," or in the logical one condition.

The counter 201 is a 0 to 39 counter, which commences counting at a preloaded start corresponding to the selected fractional MHz count. That is, the counter 201 is capable of a full 0 to 39 count, or any fractional portion thereof, depending upon the fractional MHz counted which is preloaded in. Moreover, the counter 201 utilizes a coding for the various fractional MHz levels such that a terminal count setpoint is recognized at its six output lines (careful selection of code allows for use of even fewer output lines to recognize the terminal count). Advantageously, a convenient terminal setpoint is defined as all logical ones at the output terminals of counter 201. For example, assuming the selected fractional MHz count is 0.625, the 25th increment between 0 and 0.975, and therefore that 25 "pulse swallowing" cycles of the loop will be required, the counter 201 is preloaded at the code corresponding to 0.625, and counts downwardly through 25 increments until the "all logical ones" terminal state occurs at the output lines of the counter 201. Thereupon, the counter 201 remains at the terminal count point until it is reset by a terminal count pulse from the MHz counter 212.

Logic circuitry including NAND gates 203, 204 and 206, and an inverter 205 functions cooperatively with counters 201, 212, and 214 to control counter 215 between divide by 10 and divide by 11 states. In particular, due chiefly to the operation NAND gate 203, counter 215 is in a pulse swallowing divide by 11 mode whenever the counter 201 is incrementing between its preloaded start and its terminal setpoint, Alternatively, during the remaining portion of a 40 cycle count, when counter 201 is locked at its "all logical ones" terminal setpoint, counter 215 is in a divide by 10 mode. Due principally to the functioning of NAND gate 204, the pulse swallowing divide by 11 rate occurs at counter 215 during the quarter cycles of the divide by 4 counter 214 during which terminals 208 and 209 are both logical ones. The inverter 205 accounts for the desired logic polarity, and the NAND gate 206 eliminates residual undesired pulses between successive cycles by utilizing a terminal pulse from the MHz counter 212 effectively in a sampling mode with pulses from the inverter 205. Thereby, the design problem of time lag between output and input counts is remedied.

Overall, therefore, the embodiment of FIG. 2 is seen to provide a sufficient number of quarter cycles of the divide by 4 counter 214 utilizing the pulse swallowing divide by 41 mode incrementally to increase the voltage controlled oscillator signal to the desired frequency of the selected channel. An advantageous embodiment of the MHz counter 112, and coding schemes functioning in conjunction therewith is set forth in an application of Boyd M. McClaskey and John F. Smith, filed concurrently herewith and assigned to the assignee hereof, entitled "Digital Synthesizer with Improved Coding Arrangement," Ser. No. 543,540.

A more detail representation of the fractional MHz counter 111 in conjunction with the logic 113 is set forth in an application of Boyd M. McClaskey entitled "Fractional Megahertz Counter" filed concurrently herewith, Ser. No. 543,539. Finally, a detailed circuit diagram and accompaning description for the entire embodiment of FIG. 1 is set forth in a maintenance manual published by and available from Narco Avionics, Fort Washington, Pennsylvania 19034, entitled "Narco Avionics 720 Channel Spectrum Line, Com II, Com III B tso."

It is further to be understood that the within embodiment is intended to be illustrative of the principles of the present invention, and that numerous alternative embodiments will readily occur to those of ordinary skill in the art without departure from the spirit or the scope of the present invention.

We claim:

1. A synthesizer of signals corresponding to a plurality of channels within a specified frequency band at predetermined fractional parts of predetermined frequency intervals, comprising:

means for selecting a channel for synthesis as one of said intervals and one of said fractional parts thereof;

means for generating an output signal having a frequency in said band in correspondence with one of the channels in response to a biasing signal;

first means for frequency dividing said output signal by respective first or second division factors;

second means, responsive to said means for selecting, for further dividing the once divided output signal by a third factor corresponding to said one of said intervals;

means for generating a reference signal having a frequency equal to the bandwidth of said fractional parts;

means for detecting phase difference between said reference signal and said further divided output signal, and for producing said biasing signal in response to the detected phase difference;

first logic means, responsive to the selected interval component from said means for selecting, and to further divided signals from said second means for dividing, for developing alternate control states corresponding to said first and second factors during respective complementary portions of each cycle of said second means for dividing; and second logic means, responsive to said states from said first logic means and to prior signals from said first means for frequency dividing, for controlling said first means to divide by said first and second factors for respective complementary predetermined periods of time.

2. A synthesizer as described in claim 1 wherein said third factor is larger than either of said first or second factors, and wherein second logic means includes timing means operable to regulate said respective periods of time impressed on said first means, by said second logic means, for said first and second factors together to equal one cycle of the further divided output from said second means for dividing.

3. A synthesizer as described in claim 2 which is adapted to generate channels spaced at 25 KHz in the band 118 MHz to 135.975 MHz, wherein said intervals are MHz levels, and said fractional parts are 25 KHz increments therein, and wherein said means for generating comprises a voltage controlled oscillator for generating a signal having any one of the frequencies in said band.

4. A synthesizer as described in claim 3 wherein said means for selecting designates a channel for synthesis in terms of a MHz and a KHz designation within said band, responsively to which said third factor is set in said second means for dividing at said MHz designation, and said predetermined time periods are set by said second logic means in porportion to said KHz designation.

5. A synthesizer as described in claim 4 wherein said first factor is equal to 40, said second factor is equal to 41, and said third factor is equal to said MHz designation.

6. A synthesizer as set forth in claim 4 wherein said first means for dividing comprises:

first means, operable at aternative first and second periodicities, for counting pulses of said output signal; and second means, operable at a third periodicity, for counting pulses from said first means for counting and thereby providing signals for said second means for dividing;

wherein said second means for counting develops a logical signal corresponding to its own instantaneous count and wherein said second logic means is energized by simultaneous occurrence of a predetermined instantaneous count at said second means for counting and to one of said states from said second logic means.

* * * * *